United States Patent

Peng et al.

(10) Patent No.: US 7,986,191 B2
(45) Date of Patent: Jul. 26, 2011

(54) SELF-BIASED PHASE LOCKED LOOP

(75) Inventors: Jinzhong Peng, Shanghai (CN);
Zhigang Chiachi Fu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 36 days.

(21) Appl. No.: 12/464,687

(22) Filed: May 12, 2009

(65) Prior Publication Data
US 2009/0289726 A1 Nov. 26, 2009

(30) Foreign Application Priority Data

May 26, 2008 (CN) .......................... 2008 1 0038210

(51) Int. Cl.
*H03L 7/00* (2006.01)
(52) U.S. Cl. ............. 331/16; 331/183; 331/185; 331/34
(58) Field of Classification Search .................... 331/16, 331/185, 175, 57, 183, 34
See application file for complete search history.

(56) References Cited

U.S. PATENT DOCUMENTS

| 6,873,214 B2 * | 3/2005 | Harwood ........................ 331/17 |
| 7,078,977 B2 * | 7/2006 | Maneatis ........................ 331/16 |
| 7,719,328 B2 * | 5/2010 | Fu .................................. 327/156 |

\* cited by examiner

*Primary Examiner* — Arnold Kinkead
(74) *Attorney, Agent, or Firm* — Squire, Sanders & Dempsey (US) LLP

(57) ABSTRACT

A self-biased PLL includes a first charge pump and a second charge pump, an output terminal of the first charge pump is connected with a discharge-charge capacitor to output a control voltage, an output terminal of the second charge pump is connected with an output terminal of a bias generator for outputting a first bias voltage equal to the control voltage, wherein, a current output from the first charge pump is equal to a value obtained through dividing the production of a first constant with a bias current of a voltage control oscillator by a frequency division factor of a frequency divider; a current output from the second charge pump is equal to a value obtained through dividing the bias current of the voltage control oscillator by a second constant; and a multiple relation exists between an output resistance of the bias generator and an equivalent resistance of a differential buffer delay stage in the voltage control oscillator.

5 Claims, 4 Drawing Sheets

SELF-BIASED PHASE LOCKED LOOP

This application claims the priority of Chinese Patent Application No. 200810038210.4, filed May 26, 2008, the entire disclosure of which is incorporated herein by reference.

FIELD OF THE INVENTION

The present invention relates to the phase locked loop (PLL) and in particular, to a self-biased PLL.

BACKGROUND OF THE INVENTION

The PLL is widely used in System on Chip (SOC) to construct a frequency synthesizer, a clock generator and so on. FIG. 1 shows a basic structure of a PLL. In FIG. 1, the phase frequency detector (PFD) 10 detects the frequency difference and the phase difference between the input signal $F_{ref}$ and the feedback signal $F_{fb}$ and generates and inputs pulse control signals UP and DN to the charge pump 20. In the charge pump 20, the pulse control signals UP and DN are converted into current $I_P$ so as to discharge and charge the capacitor $C_p$ in the loop filter 30. The loop filter 30 generates the control voltage $V_{ctrl}$ and input the control voltage $V_{ctrl}$ to the voltage control oscillator (VCO) 40. The VCO 40 increases the oscillation frequency when the control voltage $V_{ctrl}$ increases and decreases the oscillation frequency when the control voltage $V_{ctrl}$ decreases. The frequency divider 50 processes the output signal $F_{out}$ of the VCO 40 to generate the feedback signal $F_{fb}$. Thus, a feedback system is formed and the frequency and phase of the output signal $F_{out}$ is locked to a constant frequency and phase.

The loop bandwidth $\omega_n$ of the PLL in FIG. 1 may be obtained with formula 1) and the damping factor $\xi$ of the PLL may be obtained with formula 2).

$$\omega_n \sqrt{\frac{K_v I_p}{N C_p}} \qquad 1)$$

$$\xi = \frac{R_p}{2} \sqrt{\frac{I_p K_v C_p}{N}} \qquad 2)$$

In the formulas, $C_p$ represents the capacitance of the loop filter 30, $R_p$ represents the resistance of the loop filter 30, $I_p$ represents the current for charging and discharging the capacitor $C_p$ i.e. the charge and discharge current output from the CP 20, $K_v$ represents the gain of the VCO 40 and N represents the frequency division factor of the frequency divider 50.

The high performance and low jitter PLL should not be susceptive to the change of the process, voltage and temperature (PVT). The ratio of the loop bandwidth $\omega_n$ of the PLL to the angular frequency $\omega_{ref}$ of the input signal (referred to as input frequency for short as blew, $\omega_{ref}=2\pi F_{ref}$ and $F_{ref}$ is the frequency of the input signal) and the damping factor $\xi$ should be constant. Thus, the range of the input frequency is not limited and the loop bandwidth $\omega_n$ of the PLL may reflect the input frequency of the PLL. In the PLL shown in FIG. 1, when the current $I_p$ output from the charge pump 20, the capacitance of the capacitor $C_p$ in the loop filter 30 and the gain $K_v$ of the VCO 40 are determined, if the resistance $R_p$ of the loop filter 30 or the frequency division factor N of the frequency divider 50 changes, the ratio of the loop bandwidth $\omega_n$ to the input frequency $\omega_{ref}$ and the damping factor $\xi$ may not be constant. Therefore, the design for the PLL is constrained.

The self-biased PLL may solve the above problem, in other words, even the resistance of the loop filter or the frequency division factor of the frequency divider changes, the ratio of the loop bandwidth $\omega_n$ to the input frequency $\omega_{ref}$ and the damping factor $\xi$ may be kept constant. The reference document "Low-Jitter Process-Independent DLL and PLL Based on Self-Biased Techniques" (John G Maneatis, IEEE JOURNAL OF SOLID-STATE CIRCUITS, VOL. 31, NO. 11, NOVEMBER 1996) discloses a basic structure of the self-biased PLL. As shown in FIG. 2, the loop filter 31 includes a capacitor $C_1$ and a bias generator 60. Particularly, the bias generator 60 establishes the resistance of the loop filter 31, adds a current output from an additional charge pump 21 to the output terminal for outputting the bias voltage $V_{BP}$ in the bias generator 60. Thus, the charge pump 20 charges and discharges the capacitor $C_1$ and the charge pump 21 charges and discharges the resistance established by the bias generator 60.

The bias generator 60 is adapted to generate the bias voltages $V_{BP}$ and $V_{BN}$ from the control voltage $V_{CTRL}$ so as to provide the input voltage of the VCO 41. As shown in FIG. 3, the bias generator 60 includes a bias initiation circuit 601, an amplifier bias circuit 602, a differential amplifier circuit 603, a half-buffer replica circuit 604, a control voltage buffer circuit 605. The amplifier bias circuit provides the bias for the differential amplifier circuit 603 and the differential amplifier circuit 603 adjusts the bias voltage $V_{BN}$. Thus, the half-buffer replica circuit 604 and the control voltage buffer circuit 605 duplicates the control voltage $V_{CTRL}$ to the output terminal i.e. $V_{BP}=V_{CTRL}$.

The VCO 41 includes n (n≧3) buffer stages. For example, in FIG. 4, the VCO 41 includes three differential buffer delay stages 410 each with a symmetrical load. The bias voltage $V_{BN}$ provides bias current $2I_D$ ($I_D$ represents the current passing through the symmetrical load 411 or 412) for the symmetrical loads 411 and 412. The bias voltage $V_{BP}$ of the symmetrical load 411 or 412 is equivalent to the control voltage $V_{CTRL}$. The equivalent resistance of the symmetrical load 411 or 412 is ½ $g_m$. $g_m$ represents the transconductance of a transistor in the symmetrical load. When the control voltage $V_{CTRL}$ changes, the resistance of the symmetrical load 411 or 412 changes, the delay of the buffer stage changes and the frequency of the output signal (CK+ or CK−) from the VCO 41 also changes.

If the current $I_p$ output from the charge pumps 20 and 21 is x times than the bias current $2I_D$ of the symmetrical loads 411 and 412 and the resistance $R_p$ of the loop filter 31 established by the symmetrical load 606 in the bias generator 60 is y times than the equivalent resistance $R_o$ of the buffer stage 410 in the VCO 41, in other words, if $I_p=x\cdot 2I_D$ and $R_p=yR_o=y/2\ g_m$, the ratio of the loop bandwidth $\omega_n$ of the self-biased PLL to the input frequency $\omega_{ref}$ may be represented with formula 3) and the damping factor $\xi$ of the loop may be represented with formula 4) as follows.

$$\frac{\omega_n}{\omega_{ref}} = \frac{xN}{2\pi} \sqrt{\frac{C_B}{C_1}} \qquad 3)$$

$$\xi = \frac{y}{4} \sqrt{\frac{x}{N}} \sqrt{\frac{C_1}{C_B}} \qquad 4)$$

In the formulas, the $C_B$ represents the parasitic capacitance of the VCO 41. Therefore, if the parameters x, y and the frequency division factor N are met a certain condition through an appropriate design, the frequency division factor N may be eliminated and thus the ratio of the loop bandwidth to the input frequency $\omega_n/\omega_{ref}$ and the damping factor $\xi$ only depend on the values of the capacitance $C_B$ and $C_1$ which relate to the fabrication process.

Based on the above structure of the self-biased PLL, John G Maneatis et. al. propose a self-biased PLL (see, "Self-Biased High-Bandwidth Low-Jitter 1-to-4096 Multiplier Clock Generator PLL", IEEE JOURNAL OF SOLID-STATE CIRCUITS, VOL. 38, NO. 11, NOVEMBER 2003) in which the parameters x and y in the formulas 3) and 4) are properly designed. As shown in FIG. 5, through the programmable 1/N current mirror 70, the current $I_P$ output from the charge pump 20 and 21 is configured as 1/N times than the bias current of the VCO 41, and the resistance $R_P$ of the loop filter 32 is configured as $N \cdot C_B/C_2$ times than the equivalent resistance ½ $g_m$ of the buffer stage in the VCO 41, in other words, x=1% N and y=$N \cdot C_B/C_2$. Thus, the following formulas may be obtained.

$$\frac{\omega_n}{\omega_{ref}} = \frac{xN}{2\pi}\sqrt{\frac{C_B}{C_1'}} = \frac{\frac{1}{N}N}{2\pi}\sqrt{\frac{C_B}{C_1'}} = \frac{1}{2\pi}\sqrt{\frac{C_B}{C_1'}} \quad 5)$$

$$\xi = \frac{y}{4}\sqrt{\frac{x}{N}}\sqrt{\frac{C_1'}{C_B}} = \frac{\frac{NC_B}{C_2}}{4}\sqrt{\frac{1}{N}}\sqrt{\frac{C_1'}{C_B}} = \frac{1}{4C_2}\sqrt{C_B C_1'} \quad 6)$$

In the above formulas, $C'_1 = C_1 + C_2$. Thus, the ratio of the loop bandwidth to the input frequency $\omega_n/\omega_{ref}$ and the damping factor $\xi$ only depend on the values of the capacitance $C_B$, $C_1$ and $C_2$ which relate to the fabrication process, regardless of the resistance $R_p$ of the loop filter and the frequency division factor N of the frequency divider.

However, in the self-biased PLL shown FIG. 5, a new parameter i.e. capacitance $C_2$ is added to make the parameters x, y and the frequency division factor N meet an appropriate condition, so that the ratio of the loop bandwidth to the input frequency $\omega_n/\omega_{ref}$ and the damping factor $\xi$ are independent of the resistance $R_P$ of the loop filter and the frequency division factor N of the frequency divider. Moreover, in order to balance the voltage on the capacitor $C_1$ and $C_2$, an additional conversion circuit including a capacitor $C_2$ and a balance switch S is added. Therefore, the complexity of the circuit design is increased.

SUMMARY OF THE INVENTION

Embodiments of the invention provide a self-biased PLL so as to simplify the parameter configuration and the circuit design.

One embodiment of the invention provides a self-biased PLL, including a first charge pump and a second charge pump, an output terminal of the first charge pump is connected with a discharge-charge capacitor to output a control voltage, an output terminal of the second charge pump is connected with an output terminal of a bias generator for outputting a first bias voltage equal to the control voltage, wherein, a current output from the first charge pump is equal to a value obtained through dividing the production of a first constant with a bias current of a voltage control oscillator by a frequency division factor of a frequency divider; a current output from the second charge pump is equal to a value obtained through dividing the bias current of the voltage control oscillator by a second constant; and a multiple relation exists between an output resistance of the bias generator and an equivalent resistance of a differential buffer delay stage in the voltage control oscillator.

Optionally, the current output from the first charge pump is provided by a first current mirror, an input terminal of the first current mirror is connected with an output terminal for outputting a second bias voltage of the bias generator, the output terminal for outputting the second bias voltage of the bias generator provides a bias current for a voltage control oscillator, an output terminal of the first current mirror0 is connected with the first charge pump, and an output current of the first current mirror is $K_1/N$ times than an input current, where, $K_1$ is a first constant and N is a frequency division factor of the frequency divider; a current output from the second charge pump is provided by the second current mirror, the input terminal of the second current mirror is connected with the output terminal for generating the second bias voltage of the bias generator, the output terminal of the second current mirror is connected with the second charge pump, and the output current of the second current mirror is $1/K_2$ times than an input current, where, $K_2$ is a second constant.

Optionally, the first constant is equal to 1 and the second constant is equal to 4, the output resistance of the bias generator is equal to the equivalent resistance of a differential buffer delay stage of the voltage control oscillator.

Optionally, the first constant is equal to 1 and the second constant is equal to 40, the output resistance of the bias generator is ten times higher than the equivalent resistance of a differential buffer delay stage of the voltage control oscillator.

Optionally, the bias generator includes an amplifier bias circuit, a differential amplifier circuit, a half-buffer replica circuit and a control voltage buffer circuit; and the amplifier bias circuit is adapted to provide a bias for the differential amplifier circuit, the differential amplifier circuit is adapted to adjust a second bias voltage according to a source voltage and a control voltage, and the half-buffer replica circuit and the control voltage buffer circuit are adapted to duplicate the control voltage to the first bias voltage.

Optionally, the control voltage buffer circuit includes two PMOS transistor whose gates and drains are connected with the output terminal of the second charge pump, and the two PMOS transistors construct the output resistance of the bias generator.

Compared with the prior art, the currents output from the two charge pumps are different. The current output from the first charge pump for discharging and charging the capacitor is proportional to the bias voltage of the VCO and is inversely proportional to the frequency division factor of the frequency divider. The current output from the second charge pump for discharging and charging the resistance is proportional to the bias voltage of the VCO and is independent of the frequency division factor of the frequency divider. Thus, the second charge pump can discharge and charge the resistance directly and the ratio of the loop bandwidth to the input frequency and the damping factor are independent of the frequency division factor of the frequency divider without incorporating a new parameter. Compared with the prior art, because the new parameter is omitted, the parameter configuration of the self-biased PLL is simplified. Moreover, in the technical solution of the present invention, because the conversion circuit including the new parameter is not included, the circuit design of the self-biased PLL is simplified.

DETAILED DESCRIPTION OF THE EMBODIMENTS

Figure 1:
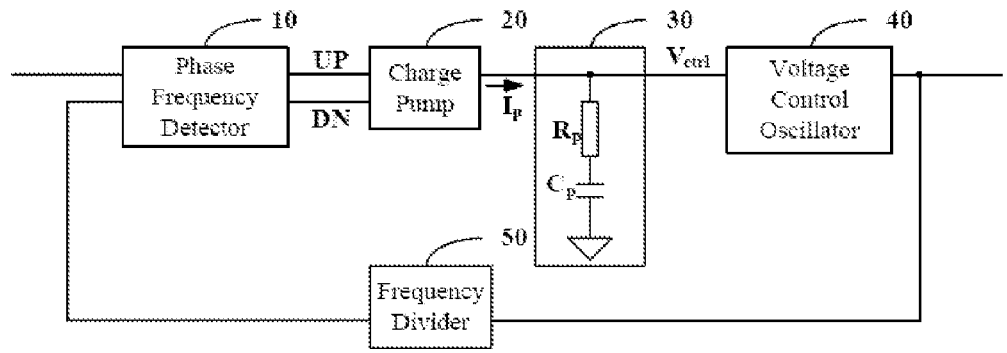
FIG. 1 is a schematic diagram showing a basic structure of a PLL.
Figure 2:
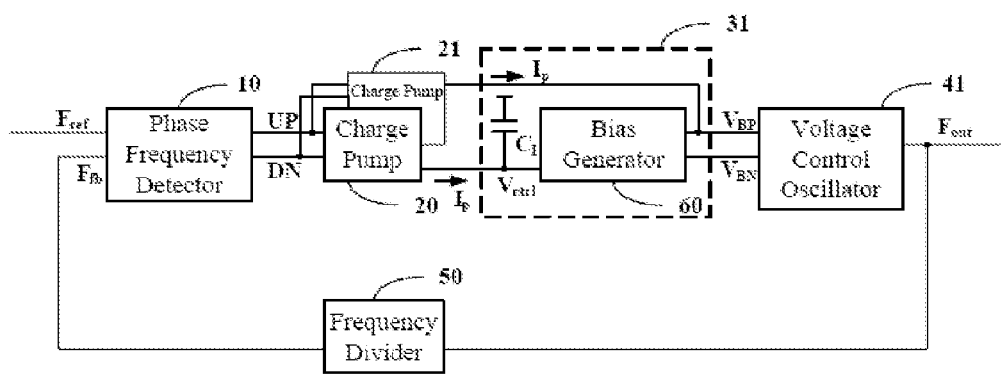
FIG. 2 is a schematic diagram showing a basic structure of a self-biased PLL.
Figure 3:
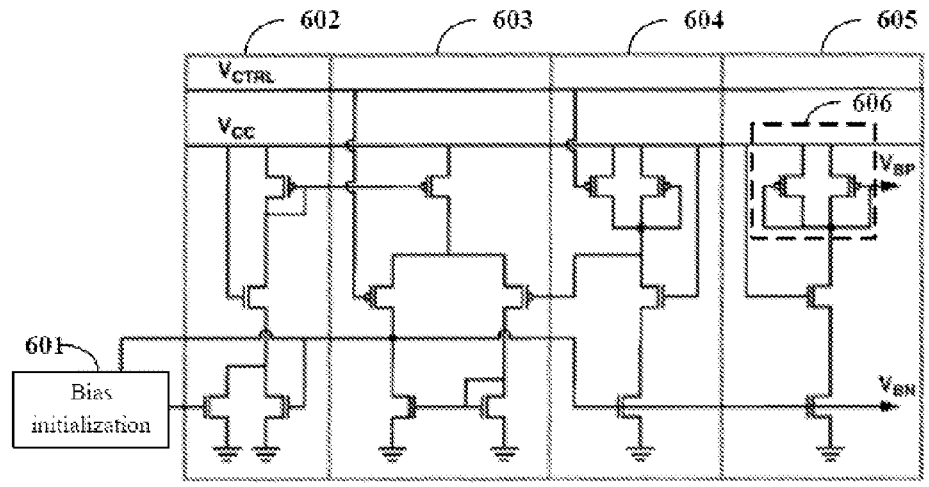
FIG. 3 is a circuit diagram showing a bias generator of the self-biased PLL illustrated in FIG. 2.

According to one embodiment of the present invention, two charge pumps are configured to output different currents, so that the parameter x in formulas 3) and 4) is inversely proportional to the frequency division factor N and the parameter y is proportional to the frequency division factor N. Therefore, the frequency division factor N in the formulas may be eliminated without incorporating a new parameter and the ratio of the loop bandwidth $\omega_n$ to the input frequency $\omega_{ref}$ and the damping factor $\xi$ which are independent of the frequency division factor N may be obtained.

The above conclusion that different currents output from two charge pumps can eliminate the frequency division factor N in the formulas 3) and 4) is obtained for the following reasons.

$$\Delta V_{ctrl} = \Delta \phi \times \frac{I_p}{2\pi} \times \left( R_p + \frac{1}{sC_p} \right) \qquad 5)$$

The formula 5) is adapted to calculate the control voltage across the loop filter in the conventional charge pump PLL, where, $\Delta V_{ctrl}$ is the control voltage across the loop filter caused by the current $I_p$ output from the charge pump, $\Delta \phi$ is the phase variation of the output signal, $R_p$ is the resistance of the loop filter, $C_p$ is the capacitance of the loop filter, s is the complex variable of the laplace transform. The formula 5) is transformed as follows.

$$\Delta V_{ctrl} = \Delta \phi \times \frac{I_p}{2\pi} \times R_p + \Delta \phi \times \frac{I_p}{2\pi} \times \frac{1}{sC_p} \qquad 5\text{-}1)$$

Thus, the currents for discharging and charging the capacitor $C_p$ and the resistor $R_p$ are separated, in other words, two charge pumps are used to discharge and charge the capacitor $C_p$ and the resistor $R_p$. As can be seen from the second item $$\Delta \phi \times \frac{I_p}{2\pi} \times \frac{1}{sC_p}$$

at the right side of the formula 5-1), the current for discharging and charging the capacitor $C_p$ is $I_p$. As for the self-biased PLL, in order to eliminate the frequency division factor N in formulas 3) and 4), the parameter x is configured to be inversely proportional to the frequency division factor N (for example, x=1% N, $I_P=2I_D/N$) and parameter y is configured to be proportional to the frequency division factor N (for example, y=N/K). Thus, the equivalent resistance of the loop filter established by the bias generator in the self-biased PLL can be expressed as follows: $R_p=yR_o=NR_o/K$. Thus, the first item $$\Delta \phi \times \frac{I_p}{2\pi} \times R_p$$

at the right side of the formula 5-1) can be transformed to be:

$$\Delta \phi \times \frac{I_p}{2\pi} \times R_p = \Delta \phi \times \frac{2I_D}{2\pi N} \times \frac{N}{K} R_O = \Delta \phi \times \frac{2I_D}{2\pi K} \times R_O \qquad 5\text{-}2)$$

As can be seen from the formula 5-2), the charge pump with the output current of $I_R=2I_D/K$ is used to discharge and charge the resistor $R_o$. In other words, the equivalent resistance ($R_P=NR_o/K$) established by the bias generator is discharged and charged with the current of $I_P=2I_D/N$.

One embodiment of the present invention provides a self-biased PLL, including: a PFD, a first charge pump, a second charge pump, a discharge-charge capacitor, a bias generator, a VCO and a frequency divider, wherein, an output terminal of the first charge pump is connected with a discharge-charge capacitor to output a control voltage, a current output from the first charge pump is equal to a value obtained through dividing the production of a first constant and a bias current of a voltage control oscillator by a frequency division factor of a frequency divider; an output terminal of the second charge pump is connected with a terminal of a bias generator for outputting the first bias voltage, the first bias voltage is equal to the control voltage, a current output from the second charge pump is equal to a value obtained through dividing a bias current of the VCO by a second constant; and a multiple relation exists between the output resistance of the bias generator and an equivalent resistance of a differential buffer delay stage in the VCO.

Figure 6:
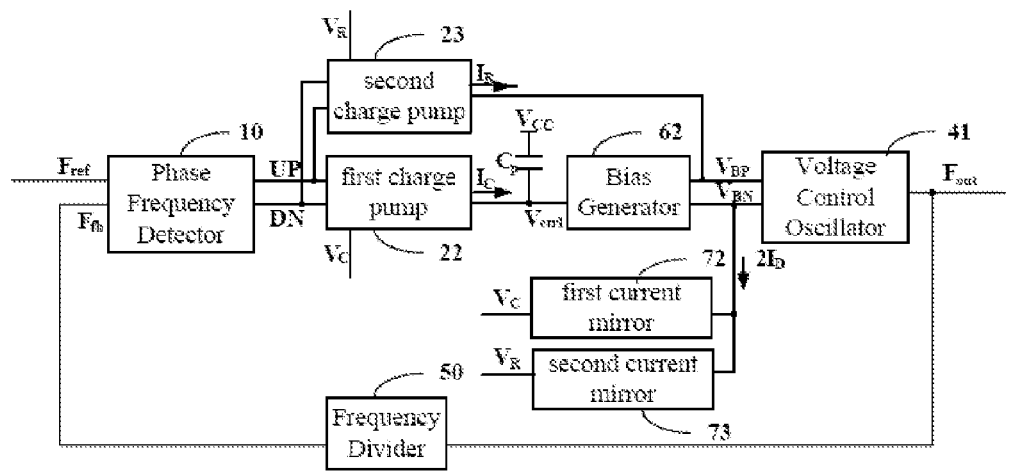
FIG. 6 is a structural diagram showing a self-PLL according to one embodiment of the present invention.

The embodiments of the present invention will be described in detail below with reference to the drawings. FIG. 6 is a schematic diagram of a basic structure of a self-biased PLL according to an embodiment of the present invention, and the self-biased PLL includes a PFD 10, a first charge pump 22, a second charge pump 23, a discharge-charge capacitor $C_p$, a bias generator 62, a VCO 41, and a frequency divider 50.

The PFD 10 detects a frequency difference and a phase difference between an input signal $F_{ref}$ and a feedback signal $F_{fb}$ and generates pulse control signals UP and DN. For example. When a phase of the feedback signal $F_{fb}$ lags behind that of the input signal $F_{ref}$, a pulse width of the pulse control signal UP is larger than that of the pulse control signal DN. When the phase of the feedback signal $F_{fb}$ leads over that of the input signal $F_{ref}$, the pulse width of the pulse control signal UP is smaller than that of the pulse control signal DN.

The first charge pump 22 converts the pulse control signals UP and DN output from the PFD 10 into a discharge and charge current $I_c$. The output terminal of the first charge pump 22 is connected with the discharge-charge capacitor $C_p$ and the control voltage $V_{ctrl}$ is output from the connection thereof. When a phase of the feedback signal $F_{fb}$ lags behind that of the input signal $F_{ref}$, a pulse width of the pulse control signal UP is larger than that of the pulse control signal DN, the first charge pump 22 outputs a charge current $I_c$ which is equal to the current input from the input terminal Vc so as to charge the capacitor $C_p$. Thus, at one side of the capacitor $C_p$ (i.e. the output terminal of the first charge pump 22), the control voltage $V_{ctrl}$ increases. When the phase of the feedback signal $F_{fb}$ leads over that of the input signal $F_{ref}$, the pulse width of the pulse control signal UP is smaller than that of the pulse control signal DN, the first charge pump 22 outputs a discharge current $I_c$ which is equal to the current input from the input terminal Vc so as to discharge the capacitor $C_p$. Thus, at the side of the capacitor $C_p$, the control voltage $V_{ctrl}$ increases.

The second charge pump 23 converts the pulse control signals UP and DN output from the PFD 10 into a discharge and charge current $I_R$. The output terminal of the second charge pump 23 is connected with the output terminal for outputting the first bias voltage $V_{BP}$ of the bias generator 62. When the phase of the feedback signal $F_{fb}$ lags behind that of the input signal $F_{ref}$, the pulse width of the pulse control signal UP is larger than that of the pulse control signal DN, the second charge pump 23 outputs a charge current $I_R$ which is equal to the current of the input terminal $V_R$ so as to charge the output resistance $R_o$ of the bias generator 62. When the phase of the feedback signal $F_{fb}$ leads over that of the input signal $F_{ref}$, the pulse width of the pulse control signal UP is smaller than that of the pulse control signal DN, the second charge pump 23 outputs a discharge current $I_R$ which is equal to the current at the input terminal $V_R$ so as to discharge the output resistance $R_o$ of the bias generator 62.

The bias generator 62 includes an input terminal for inputting the control voltage $V_{CTRL}$, a first output terminal for outputting a first bias voltage $V_{BP}$, and a second output terminal for outputting a second bias voltage $V_{BN}$. The bias generator 62 generates the first bias voltage $V_{BP}$ and the second bias voltage $V_{BN}$ from the control voltage $V_{CTRL}$. The control voltage $V_{CTRL}$ is duplicated to the first bias voltage $V_{BP}$ at the output terminal.

The VCO 41 outputs the first bias voltage $V_{BP}$ and the second bias voltage $V_{BN}$. When the first bias voltage $V_{BP}$ increases, the oscillation frequency of the output signal $F_{out}$ is fastened. When the first bias voltage $V_{BP}$ decreases, the oscillation frequency of the output signal $F_{out}$ is slowed down. The second bias voltage $V_{BN}$ provides the bias current $2I_D$ for the VCO 41.

The output signal $F_{out}$ of the VCO 41 generates a feedback signal $F_{fb}$ through the frequency divider 50, that is, $F_{fb}=F_{out}/N$, where N represents the frequency division factor of the frequency divider 50. Thus, a feedback system is formed, and the frequency and phase of the output signal $F_{out}$ are locked to a fixed frequency and phase.

According to the above analysis based on formulas 5-1) and 5-2), the current $I_C$ output from the first charge pump 22 is different from the current $I_R$ output from the second charge pump 23. Particularly, the current $I_C$ output from the first charge pump 22 is adapted to discharge and charge the capacitor $C_P$ and is equal to a value obtained through dividing the production of a first constant $K_1$ and the bias current $2I_D$ of the VCO 41 by the frequency division factor N of the frequency divider 50, and the current $I_R$ output from the second charge pump 23 is adapted to discharge and charge the resistance Ro and is equal to a ratio of the bias current $2I_D$ to the second constant $K_2$. That is, $$I_C = \frac{K_1}{N} \cdot 2I_D, \quad I_R = \frac{1}{K_2} \cdot 2I_D$$

A current mirror, in which a multiple relation exists between an input current and an output current, is adapted to realize the relation that the currents output from the first charge pump 22 and the second charge pump 23 is proportional to the bias current $2I_D$ of the VCO 41. The structure of the current mirror is well known to those skilled in the art, for example, a reference document "Self-Biased High-Bandwidth Low-Jitter 1-to-4096 Multiplier Clock Generator PLL" describes the current mirror. Therefore, a detailed description of the current mirror is omitted herein. As shown in FIG. 6, the input terminals of the first current mirror 72 and the second current mirror 73 are connected with the second output terminal for outputting the second bias voltage of the bias generator 62 (i.e. the input bias current $2I_D$). The output terminal $V_C$ of the first current mirror is connected with the input terminal $V_C$ of the first charge pump 22 so as to provide the current for the first charge pump 22. The output current of the first current mirror 72 is $K_1/N$ times than the input current, so that the current $I_C$ output from the first charge pump 22 is equal to a value obtained through dividing the production of the first constant $K_1$ and the bias current $2I_D$ of the VCO 41 by the frequency division factor N of the frequency divider 50. The output terminal $V_R$ of the second current mirror 73 is connected with the input terminal $V_R$ of the second charge pump 23 so as to provide the current for the second charge pump 23. The output current of the second current mirror 73 is $1/K_2$ times than the input current so that the current $I_R$ output from the second charge pump 23 is equal to a ratio of the bias current $2I_D$ to the second constant $K_2$.

Figure 7:
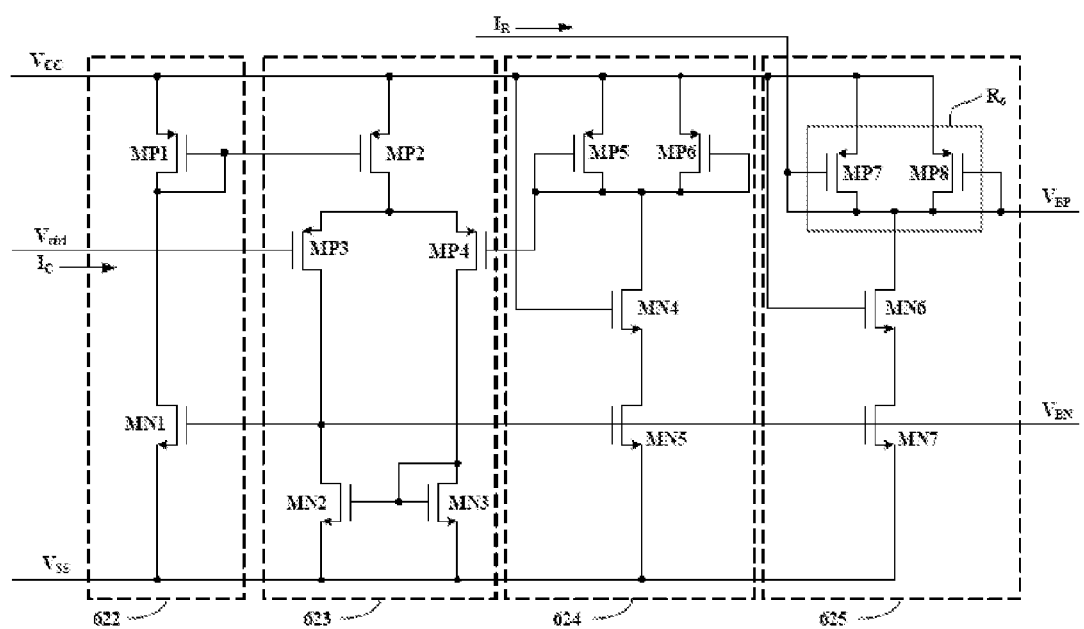
FIG. 7 is a circuit diagram showing a bias generator of the self-biased PLL illustrated in FIG. 6.

FIG. 7 is the circuit diagram of the bias generator 62 according to the embodiment of the present invention. The bias generator 62 includes: an amplifier bias circuit 622, a differential amplifier circuit 623, a half-buffer replica circuit 624 and a control voltage buffer circuit 625.

The amplifier bias circuit 622 provides the bias for the differential amplifier circuit 623, and includes a first PMOS transistor MP1 and a first NMOS transistor MN1. The gate of the first PMOS transistor MP1 is connected with the drain of MP1. A first voltage $V_{CC}$ (normally, the source voltage i.e. operation voltage) is inputted to the source of the first PMOS transistor MP1. The drain of the first NMOS transistor MN1 is connected with the drain of the first PMOS transistor MP1. A second voltage Vss (normally, ground voltage) is input to the source of the first NMOS transistor MN1.

The differential amplifier circuit 623 adjusts the second bias voltage $V_{BN}$ according to the source voltage and the control voltage $V_{CTRL}$ and includes a second PMOS transistor MP2, a third PMOS transistor MP3, a fourth PMOS transistor MP4, a second NMOS transistor MN2 and a third NMOS transistor MN3. The first voltage $V_{CC}$ is input to the source of the second PMOS transistor MP2. The gate of the second PMOS transistor MP2 is connected with the drain of the first PMOS transistor MP1. The control voltage $V_{CTRL}$ is inputted to the gate of the third PMOS transistor MP3. The drain of the third PMOS transistor MP3 is connected with the drain of the first NMOS transistor MN1. The source of the third PMOS transistor MP3 and the source of the fourth PMOS transistor MP4 are connected with the drain of the second PMOS transistor MP2. The drain of the second NMOS transistor MN2 is connected with the drain of the third PMOS transistor MP3 and the drain and gate of the third NMOS transistor MN3 are connected with the drain of the fourth PMOS transistor MP4. The gate of the second NMOS transistor MN2 is connected with the gate of the third NMOS transistor MN3. The second voltage Vss is input to the source of the second NMOS transistor MN2 and the source of the third NMOS transistor MN3. The voltage output from the drain of the third PMOS transistor MP3 is the second bias voltage $V_{BN}$.

The half-buffer replica circuit 624 is connected with the differential amplifier circuit 623. The half-buffer replica circuit 624 and the control voltage buffer circuit 625 duplicate the control voltage $V_{CTRL}$ to the first bias voltage $V_{BP}$ at the output terminal i.e. $V_{BP}=V_{CTRL}$. If the source voltage and control voltage $V_{CTRL}$ change, the differential amplifier circuit 623 adjusts the second bias voltage $V_{BN}$ so as to keep the first bias voltage $V_{BP}$ be equal to $V_{CTRL}$.

The half-buffer replica circuit 624 includes a fifth PMOS transistor MP5, a sixth PMOS transistor MP6, a fourth NMOS transistor MN4 and a fifth NMOS transistor MN5. The gate of the fifth PMOS transistor MP5 is connected with the gate of the fourth PMOS transistor MP4. The gate and drain of the fifth PMOS transistor MP5 are connected with the gate and drain of the sixth PMOS transistor MP6. The first voltage $V_{CC}$ is input to the source of the fifth PMOS transistor MP5, the source of the sixth PMOS transistor MP6, the gate of the fourth NMOS transistor MN4. The drain of the fourth NMOS transistor MN4 is connected with the drain of the fifth PMOS transistor MP5. The source of the fourth NMOS transistor MN4 is connected with the drain of the fifth NMOS transistor MN5. The second bias voltage $V_{BN}$ is input to the gate of the fifth NMOS transistor MN5 and the second voltage $V_{SS}$ is input to the source of the fifth NMOS transistor MN5.

The control voltage buffer circuit 625 includes a seventh PMOS transistor MP7, a eighth PMOS transistor MP8, a sixth NMOS transistor MN6 and a seventh NMOS transistor MN7. The gate and the drain of the seventh PMOS transistor MP7 are connected with the gate and the drain of the eighth PMOS transistor MP8 and also connected with the output terminal of the second charge pump 23. The voltage output from the drain of the seventh PMOS transistor MP7 and the drain of the eighth PMOS transistor MP8 is the first bias voltage $V_{BP}$. The voltage input to the source of the seventh PMOS transistor MP7, the source of the eighth PMOS transistor MP8 and the gate of the sixth NMOS transistor MN6 is the first voltage $V_{CC}$. The drain of the sixth NMOS transistor MN6 is connected with the drain of the seventh PMOS transistor MP7. The source of the sixth NMOS transistor MN6 is connected with the drain of the seventh NMOS transistor MN7. The voltage input to the seventh NMOS transistor MN7 is the second bias voltage $V_{BN}$ and the voltage input to the source of the seventh NMOS transistor MN7 is the second voltage $V_{SS}$. The seventh PMOS transistor MP7 and the eighth PMOS transistor MP8 constitutes the output resistance Ro of the bias generator 62. The second charge pump 23 discharges and charges the output resistance Ro.

The VCO 41 includes n (n≧3) buffer stages connected in series. For example, in FIG. 4, the VCO 41 includes three differential buffer delay stages 410 each with a symmetrical load. The positive input of the next differential buffer delay stage 410 is connected with the negative output of the previous differential buffer delay stage 410 and the negative input of the next differential buffer delay stage 410 is connected with the positive output of the previous differential buffer delay stage 410. The bias voltage $V_{BN}$ provides the bias current $2I_D$ for the symmetrical loads 411 and 412, that is, the current passing through the symmetrical load 411 or 412 is $I_D$. The bias voltage $V_{BP}$ of the symmetrical load 411 or 412 is equal to the control voltage $V_{CTRL}$ and the equivalent resistance of the symmetrical load 411 or 412 is equal to $\frac{1}{2} g_m \cdot g_m$ represents the transconductance of a transistor in the symmetrical load. When the control voltage $V_{CTRL}$ changes, the resistance of the symmetrical load 411 or 412 changes, the delay of the buffer stage changes and the frequency of the output signal $F_{out}$ (CK+ or CK−) at the VCO 41 also changes.

Figure 4:
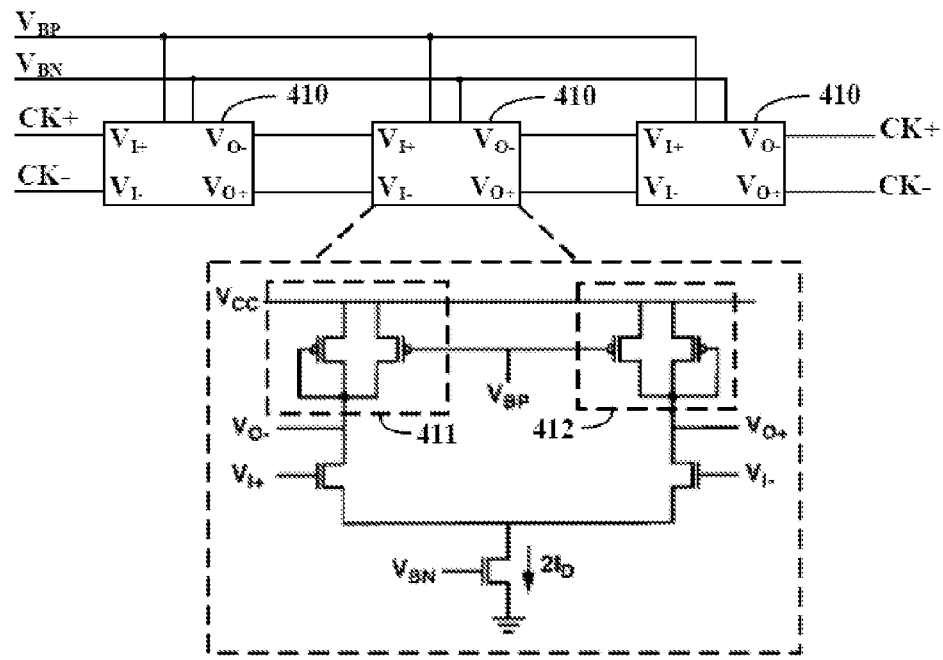
FIG. 4 is a circuit diagram showing a VCO of the self-biased PLL illustrated in FIG. 2.
Figure 5:
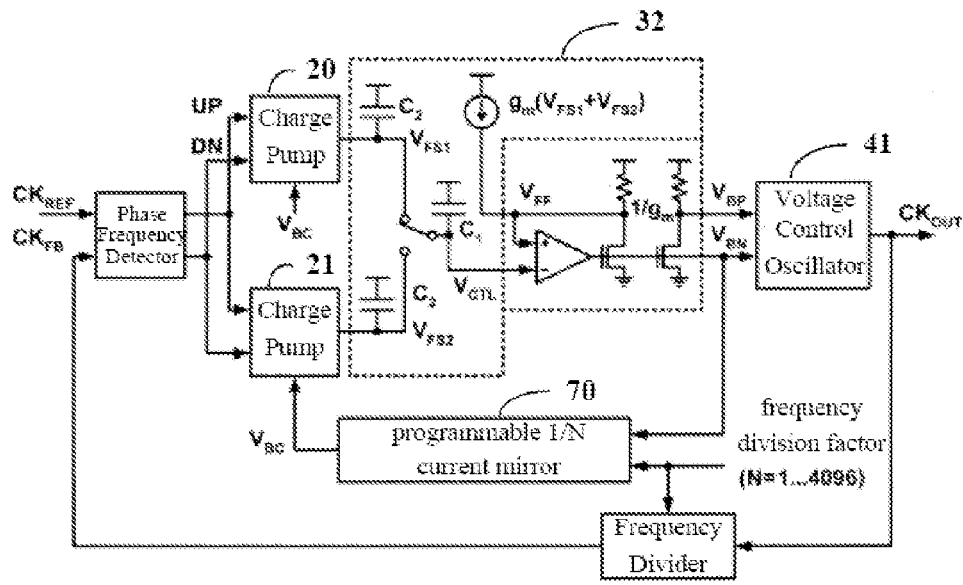
FIG. 5 is structural diagram showing an embodiment of a self-biased PLL in the prior art.

With reference to FIGS. 6, 7 and 4, the current $I_C$ output from the first charge pump 22 is x times than the bias current $2I_D$ of the VCO 41 i.e. $I_C=x \cdot 2I_D$ and $x=K_1/N$. The current $I_C$ output from the first charge pump 22 is the current for discharging and charging the capacitor $C_p$. By substitution of $I_p$ into formulas 1) and 2), the current $I_R$ output from the second charge pump 23 is $1/K_2$ times than the bias current $2I_D$ of the VCO 41 and the output resistance $R_o$ of the bias generator 62 is equal to the equivalent resistance $\frac{1}{2} g_m$ of the buffer delay stage 410 in the VCO 41. Thus, the equivalent resistance $R_P$ established in the bias generator 62 is y times than the equivalent resistance $\frac{1}{2} g_m$ of the buffer delay stage 410, i.e. $R_P = y R_O = y/2 g_m$ and $y = N/K_2$. By substitution of parameters x and y into formulas 3) and 4), the ratio of the loop bandwidth $\omega_n$ of the self-biased PLL according to the embodiment of the present invention to the input frequency $\omega_{ref}$ may be represented with formula 6) and the damping factor $\xi$ of the loop may be represented with formula 7):

$$\frac{\omega_n}{\omega_{ref}} = \frac{xN}{2\pi}\sqrt{\frac{C_B}{C_1}} = \frac{\frac{K_1}{N}N}{2\pi}\sqrt{\frac{C_B}{C_1}} = \frac{K_1}{2\pi}\sqrt{\frac{C_B}{C_1}} \quad 6)$$

$$\xi = \frac{y}{4}\sqrt{\frac{x}{N}}\sqrt{\frac{C_1}{C_B}} = \frac{\frac{N}{K_2}}{4}\sqrt{\frac{\frac{K_1}{N}}{N}}\sqrt{\frac{C_1}{C_B}} = \frac{1}{4K_2}\sqrt{K_1}\sqrt{\frac{C_1}{C_B}} \quad 7)$$

The values of $K_1$ and $K_2$ are allowed if the condition that the ratio of the loop bandwidth to the input frequency $\omega_n/\omega_{ref}$ ranges from 1% to 5% and the damping factor $\xi$ ranges from 0.7 to 1.2 is met. In one embodiment of the present invention, considering the locking time, power consumption and speed of the PLL, if it is assumed that $K_1=1$ and $K_2=4$, the output resistance $R_o$ of the bias generator 62 is equal to the equivalent resistance of the buffer delay stage 410 in the VCO 41. Moreover, in order to reduce the current $I_R$ output from the second charge pump 23, the output resistance $R_o$ of the bias generator 62 may be increased by 10 times. According to formula 5-2), the current $I_R$ output from the second charge pump 23 may be decreased by 1/10. Therefore, in the actual circuit design, it is assumed that $K_1=1$ and $K_2=40$, the output resistance $R_o$ is 10 times higher than the equivalent resistance of the buffer delay stage 410 in the VCO 41. Optionally, the output resistance $R_o$ is not limited to be amplified by 10 times, other times such as 6 times, 20 times and 15 times and so on may also be adopted. Correspondingly, the current $I_R$ output from the second charge pump 23 may be reduced by 1/6, 1/20 and 1/15 and so on. In other words, a multiple relation exists between the output resistance $R_o$ of the bias generator 62 and the equivalent resistance $\frac{1}{2} g_m$ of the differential buffer delay stage 410 in the VCO 41.

As can be seen from the formulas 6) and 7), the ratio of the loop bandwidth to the input frequency $\omega_n/\omega_{ref}$ and the damping factor $\xi$ are determined by the capacitance $C_B$ and $C_1$ which are dependent on the fabrication process, and are independent of the equivalent resistance $R_P$ established by the bias generator 62 and the frequency division factor N of the frequency divider 50. That is, by changing the frequency division factor N of the frequency divider 50, the damping factor $\xi$ may be kept as constant while the frequency range of the input signal $F_{ref}$ is not limited. Thus, the loop bandwidth $\omega_n$ is able to reflect the input frequency $\omega_{ref}$ of the PLL.

In the prior art, because the current output from the charge pump for discharging and charging the capacitor is the same as that output from the charge pump for discharging and charging the resistance, the charge pump for discharging and charging the resistance are unable to directly discharge and charge the resistance and a new parameter needs to be incorporated. Moreover, the ratio of the loop bandwidth to the input frequency and the damping factor which are independent of the frequency division factor of the frequency divider are obtained through a conversion circuit. While in embodiments of the present invention, the currents output from the two charge pumps are different, in particularly, the current output from the first charge pump for discharging and charging the capacitor is proportional to the bias current of the VCO and is inversely proportional to the frequency division factor of the frequency divider, the current output from the second charge pump for discharging and charging the resistance is proportional to the bias current of the VCO and is independent of the frequency division factor of the frequency divider. Thus, the second charge pump can charge the resistance directly and no new parameter needs to be incorporated to eliminate the frequency division factor in the formulas and make the ratio of the loop bandwidth to the input frequency and the damping factor of the loop be independent of the frequency division factor of the frequency divider.

In summary, according to the embodiments of the present invention, the parameter $C_2$ in the prior art is omitted, thus, the parameter configuration of the self-biased PLL is simplified. In addition, the conversion circuit including capacitor $C_2$, balance switch S and so on, is not needed, thus, the circuit design of the self-biased PLL is simplified. Moreover, according to the embodiments of the present invention, because the balance switch S is not needed, the voltage jitter and the circuit noise caused by the switch may be avoided and the performance of the self-biased PLL is improved.

Although the present invention has been disclosed as above with reference to preferred embodiments thereof but will not be limited thereto. Those skilled in the art can modify and vary the embodiments without departing from the spirit and scope of the present invention. Accordingly, the scope of the present invention shall be defined in the appended claims.

What is claimed:

1. A self-biased phase locked loop, PLL, comprising a first charge pump and a second charge pump, an output terminal of the first charge pump is connected with a discharge-charge capacitor to output a control voltage, an output terminal of the second charge pump is connected with an output terminal of a bias generator for outputting a first bias voltage which is equal to the control voltage, wherein, a current output from the first charge pump is equal to a value obtained through dividing the production of a first constant with a bias current of a voltage control oscillator by a frequency division factor of a frequency divider;

a current output from the second charge pump is equal to a value obtained through dividing the bias current of the voltage control oscillator by a second constant;

a multiple relation exists between an output resistance of the bias generator and an equivalent resistance of a differential buffer delay stage in the voltage control oscillator;

the current output from the first charge pump is provided by a first current mirror, an input terminal of the first current mirror is connected with an output terminal of the bias generator for outputting a second bias voltage, the output terminal of the bias generator for outputting the second bias voltage provides a bias current for the voltage control oscillator, an output terminal is connected with the first charge pump, and an output current of the first current mirror is $K_1/N$ times than an input current, where, $K_1$ is a first constant and N is a frequency division factor of the frequency divider; and a current output from the second charge pump is provided by the second current mirror, the input terminal of the second current mirror is connected with the output terminal of the bias generator for outputting the second bias voltage, the output terminal of the second current mirror is connected with the second charge pump, and the output current of the second current mirror is $1/K_2$ times than an input current, where, $K_2$ is a second constant.

2. The self-biased PLL according to claim 1, wherein, the first constant is equal to 1 and the second constant is equal to 4, the output resistance of the bias generator is equal to the equivalent resistance of the differential buffer delay stage in the voltage control oscillator.

3. The self-biased PLL according to claim 1, wherein, the first constant is equal to 1 and the second constant is equal to 40, the output resistance of the bias generator is ten times higher than the equivalent resistance of the differential buffer delay stage in the voltage control oscillator.

4. The self-biased PLL according to claim 1, wherein, the bias generator comprises an amplifier bias circuit, a differential amplifier circuit, a half-buffer replica circuit and a control voltage buffer circuit; and the amplifier bias circuit is adapted to provide a bias for the differential amplifier circuit, the differential amplifier circuit is adapted to adjust a second bias voltage according to a source voltage and a control voltage, and the half-buffer replica circuit and the control voltage buffer circuit are adapted to duplicate the control voltage to the first bias voltage.

5. The self-biased PLL according to claim 4, wherein, the control voltage buffer circuit includes two PMOS transistors whose gates and drains are connected with the output terminal of the second charge pump, and the two PMOS transistors construct the output resistance of the bias generator.

* * * * *

UNITED STATES PATENT AND TRADEMARK OFFICE
CERTIFICATE OF CORRECTION

| | | |
|---|---|---|
| PATENT NO. | : 7,986,191 B2 | Page 1 of 1 |
| APPLICATION NO. | : 12/464687 | |
| DATED | : July 19, 2011 | |
| INVENTOR(S) | : Jinzhong Peng et al. | |

It is certified that error appears in the above-identified patent and that said Letters Patent is hereby corrected as shown below:

Title Page;
At (75) of bibliographic data, inventor name "Zhigang Chiachi Fu" is replaced by --Zhigang Fu--

Signed and Sealed this
Twenty-second Day of November, 2011

David J. Kappos
*Director of the United States Patent and Trademark Office*